United States Patent
Hashimoto

(10) Patent No.: US 10,084,120 B2
(45) Date of Patent: Sep. 25, 2018

(54) METHOD OF PRODUCING LIGHT TRANSMISSIVE ELEMENT AND METHOD OF PRODUCING LIGHT EMITTING DEVICE

(71) Applicant: NICHIA CORPORATION, Anan-shi, Tokushima (JP)

(72) Inventor: Toru Hashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/617,140

(22) Filed: Jun. 8, 2017

(65) Prior Publication Data
US 2017/0358720 A1 Dec. 14, 2017

(30) Foreign Application Priority Data
Jun. 14, 2016 (JP) ................. 2016-117756

(51) Int. Cl.
| | | |
|---|---|---|
| *H01L 33/50* | (2010.01) | |
| *H01L 33/60* | (2010.01) | |
| *H01L 33/00* | (2010.01) | |
| *B29D 11/00* | (2006.01) | |
| *C09K 11/61* | (2006.01) | |

(Continued)

(52) U.S. Cl.
CPC ...... *H01L 33/507* (2013.01); *B29D 11/00663* (2013.01); *C09K 11/0883* (2013.01); *C09K 11/617* (2013.01); *C09K 11/646* (2013.01); *H01L 33/0079* (2013.01); *H01L 33/502* (2013.01); *H01L 33/60* (2013.01); *B29K 2083/00* (2013.01); *B29K 2105/16* (2013.01); *B29K 2995/0026* (2013.01);
(Continued)

(58) Field of Classification Search
CPC .... B29D 11/00663–11/00721; C09K 11/0883; C09K 11/617; C09K 11/646; H01L 33/0079; H01L 33/502; H01L 33/60; H01L 33/507
See application file for complete search history.

(56) References Cited

U.S. PATENT DOCUMENTS

| | | | |
|---|---|---|---|
| 2012/0039066 A1* | 2/2012 | Hatanaka ............... | C25D 11/06 362/84 |
| 2015/0318453 A1* | 11/2015 | Hung .................... | H01L 33/508 257/98 |

(Continued)

FOREIGN PATENT DOCUMENTS

| | | |
|---|---|---|
| JP | 2005-262496 A | 9/2005 |
| JP | 2014-110333 A | 6/2014 |

(Continued)

*Primary Examiner* — Daniel Shook

(57) ABSTRACT

A method of producing a light transmissive element includes providing a holding member including an upper surface and a plurality of holes, each of the plurality of holes having at least one inner lateral surface that is a substantially smooth surface and an opening in the upper surface of the holding member; filling the plurality of holes with a wavelength conversion member containing fluorescent particles and a light transmissive member such that the wavelength conversion member is in contact with the inner lateral surface of each of the plurality of holes; molding the wavelength conversion member; and taking out the wavelength conversion member from the holding member after the molding of the wavelength conversion member.

11 Claims, 11 Drawing Sheets

(51) Int. Cl.
*C09K 11/64* (2006.01)
*C09K 11/08* (2006.01)
*B29K 83/00* (2006.01)
*B29K 105/16* (2006.01)

(52) U.S. Cl.
CPC ............... *B29K 2995/0035* (2013.01); *H01L 2933/0041* (2013.01); *H01L 2933/0058* (2013.01)

(56) References Cited

U.S. PATENT DOCUMENTS

| | | |
|---|---|---|
| 2016/0093781 A1 | 3/2016 | Tamaki et al. |
| 2016/0111610 A1* | 4/2016 | Ota ................... H01L 21/02601 257/89 |
| 2017/0005243 A1 | 1/2017 | Sajiki |

FOREIGN PATENT DOCUMENTS

| | | |
|---|---|---|
| JP | 2016-072471 A | 5/2016 |
| JP | 2017-017159 A | 1/2017 |

\* cited by examiner

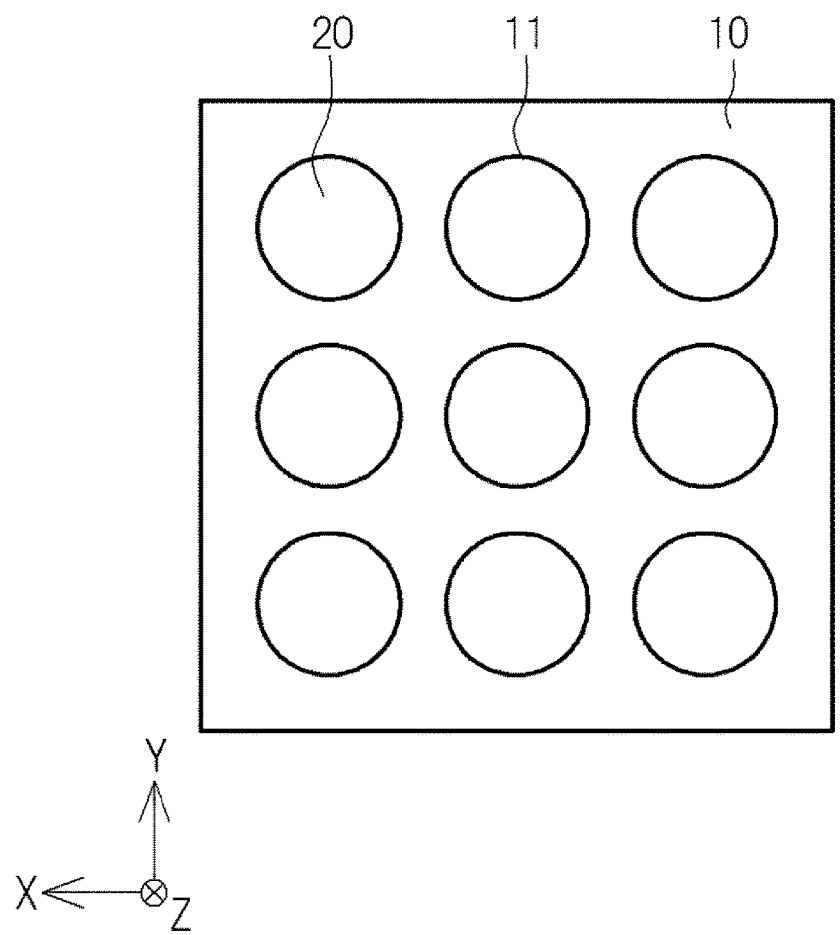

*FIG.13*
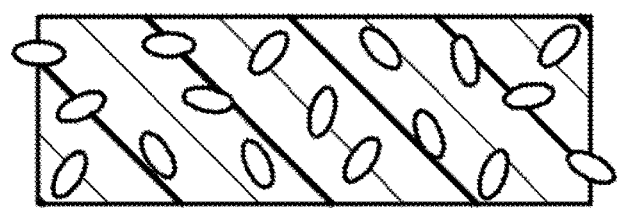
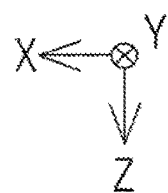

METHOD OF PRODUCING LIGHT TRANSMISSIVE ELEMENT AND METHOD OF PRODUCING LIGHT EMITTING DEVICE

CROSS-REFERENCE TO RELATED APPLICATION

This application claims priority to Japanese Patent Application No. 2016-117756, filed on Jun. 14, 2016, the disclosure of which is hereby incorporated by reference in its entirety.

BACKGROUND

The present disclosure relates to a method of producing a light transmissive element and a method of producing a light emitting device.

Recently, light emitting diodes are used in various forms in the fields of general illumination devices and automotive illumination devices along with improvement in quality thereof. For example, Japanese Laid-Open Patent Publication No. 2014-110333 discloses a light emitting device including a fluorescent sheet disposed on an LED die, and a white reflective member disposed on a lateral surface of the LED die and a lateral surface of the fluorescent sheet. In the method of producing the light emitting device, after bonding LED dies to a large fluorescent sheet, cutting with a blade or the like is performed at portions except for bonding portions between the fluorescent sheet and the LED dies and portions in the vicinity thereof, so that the large fluorescent sheet is singulated.

SUMMARY

An embodiment of the present disclosure provides a method of producing a light transmissive element and a method of producing a light emitting device without cutting large fluorescent sheet.

A method of producing a light transmissive element in an embodiment according to the present disclosure includes: providing a holding member including an upper surface and a plurality of holes, each of the plurality of holes having at least one inner lateral surface that is a substantially smooth surface and an opening in the upper surface of the holding member; filling the plurality of holes with a wavelength conversion member containing fluorescent particles and a light transmissive member such that the wavelength conversion member is in contact with the inner lateral surface of each of the plurality of holes; molding the wavelength conversion member; and taking out the wavelength conversion member from the holding member after the molding of the wavelength conversion member.

According to certain embodiments of the present disclosure, a plurality of light transmissive elements can be obtained without cutting a large fluorescent sheet.

BRIEF DESCRIPTION OF THE DRAWINGS

FIG. 2 is a plan view showing a variant example of the holding member.

FIG. 13 is a schematic cross-sectional view showing fluorescent particles protruding from a surface of a fluorescent sheet.

DETAILED DESCRIPTION

In the case where a large fluorescent sheet containing fluorescent particles is singulated by cutting, as shown in FIG. 13, fluorescent particles at cut portions of the large fluorescent sheet may be failed to be cut depending on the hardness thereof or the like, and may protrude from a cut surface of the singulated fluorescent sheet. Accordingly, in the case where a white reflective member is disposed on a lateral surface of the fluorescent sheet, the fluorescent particles protruding from the cut surface may penetrate the white reflective member, or the thickness of the white reflective member in a lateral direction may be decreased by the amount of protrusion of the fluorescent particles. With this structure, light from the LED die easily leaks through the white reflective member. In view of the above, the inventor has devised a method of producing a light transmissive element and a method of producing a light emitting device without cutting a large fluorescent sheet therein.

Hereinafter, certain embodiments of the present disclosure will be described in detail with reference to the drawings. In the description below, terms representing a specific direction or position (e.g., "up", "down", or another term including such a term) will be used when necessary. Such terms will be used for easier understanding of the present disclosure with reference to the drawings, and such terms does not limit the technical scope of the present disclosure. The same reference signs in a plurality of drawings indicate the same portions or components.

First Embodiment

With reference to FIG. 1A through FIG. 5, a method of producing a light transmissive element in a first embodiment will be described.

A method of producing a light transmissive element in the first embodiment includes providing a holding member including an upper surface and a plurality of holes, each of the plurality of holes having at least one inner lateral surface that is a substantially smooth surface and an opening in the upper surface of the holding member; filling each of the plurality of holes with a wavelength conversion member containing fluorescent particles and a light transmissive member such that the wavelength conversion member is in contact with the inner lateral surface of each of the plurality of holes; molding the wavelength conversion member; and taking out the wavelength conversion member from the holding member after molding the wavelength conversion member. Hereinafter, each of the steps will be described in detail.

Production of the Light Transmissive Element

Step 1-1: Providing a Holding Member 10

Figure 1A:
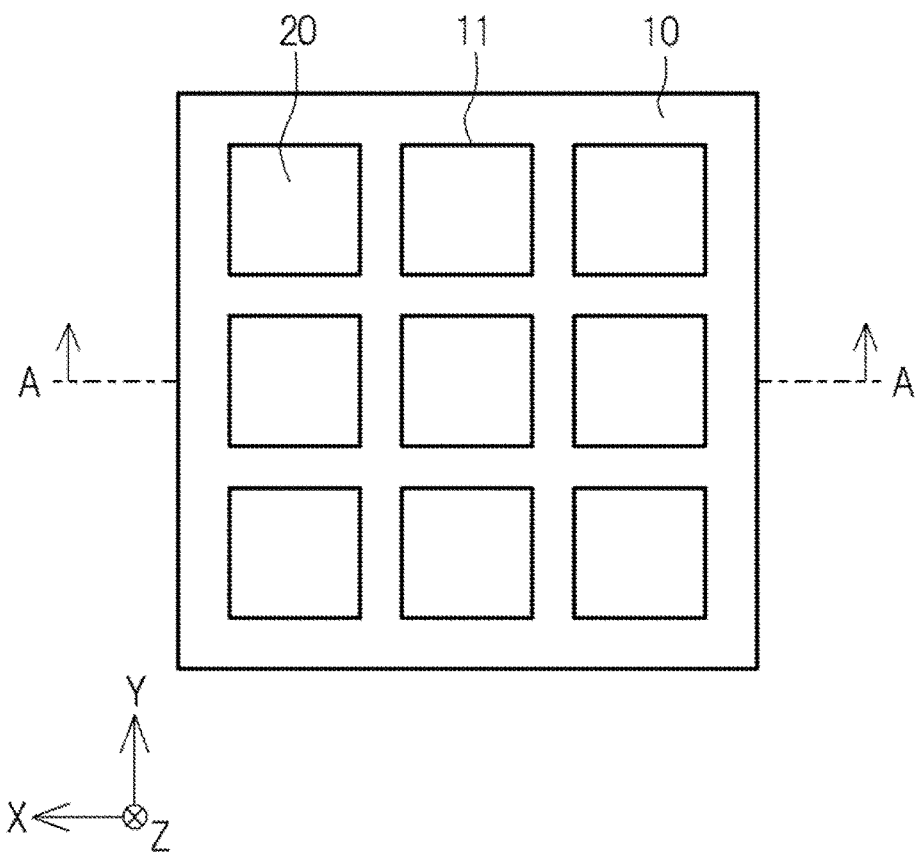
FIG. 1A is a plan view showing a step of providing a holding member in a first embodiment.
Figure 1B:
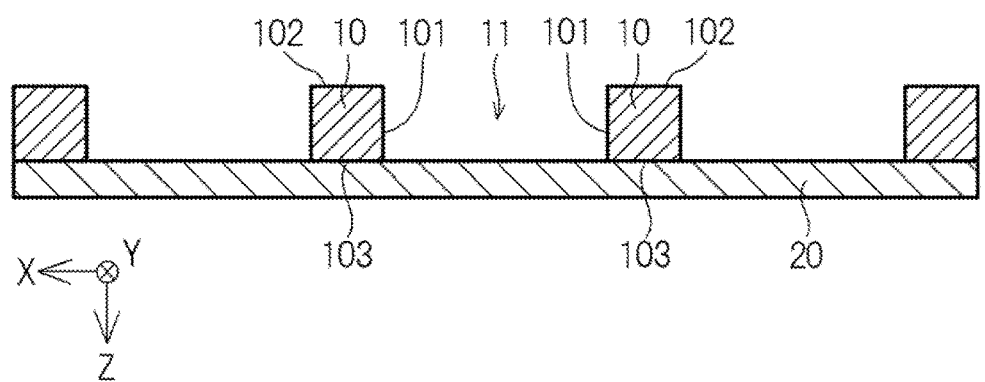
FIG. 1B is a schematic cross-sectional view taken along line A-A in FIG. 1A.

As shown in FIG. 1B, the holding member 10 is provided.

Figure 3A:
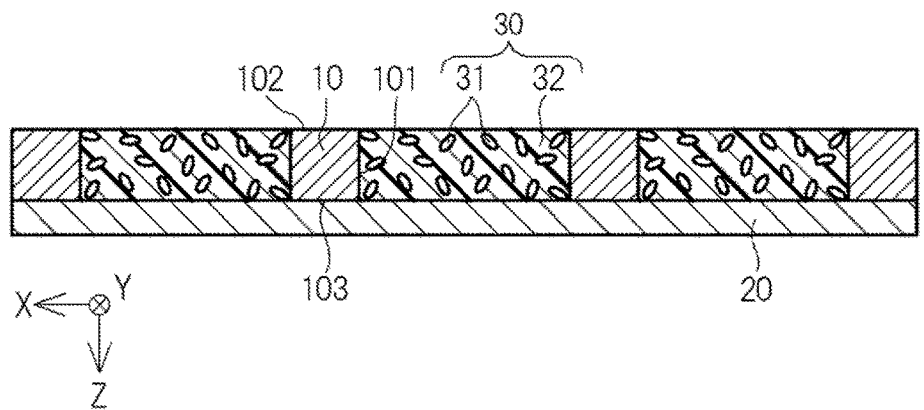
FIG. 3A is a schematic cross-sectional view showing a step of filling each of a plurality of holes with a wavelength conversion member in the first embodiment.

The holding member 10 includes an upper surface 102, and a plurality of holes each having an opening in the upper surface 102. Each of the holes has at least one inner lateral surface 101 that are substantially smooth in a cross-sectional view. In other words, the holding member 10 includes a plurality of holes opened upward, and the inner lateral surfaces 101 defining each of the plurality of holes are substantially smooth surfaces. In the first embodiment, the plurality of holes are through-holes 11, which extends through the upper surface 102 and a lower surface 103 of the holding member 10. In this specification, the term "substantially smooth surface" refers to a surface with no irregularities or a surface with almost no irregularities. More specifically, the "substantially smooth surface" may have irregularities having a height or depth of 10 μm or less. As seen in a plan view, the through-holes 11 may each have a polygonal shape such as a quadrangular shape as shown in FIG. 1A, a pentagonal shape, a hexagonal shape or the like, which is made of straight lines, or may each have a circular shape, which is made of a curved line, as shown in FIG. 2. Alternatively, the through-holes 11 may each have a shape formed of a straight line and a curved line in a plan view. With a shape including rounded corners in a plan view, an entirety of each of the through-holes 11 can be easily filled with a wavelength conversion member 30 (FIG. 3A; described below).

The through-holes 11 may be formed in the holding member 10 by any appropriate method known in the art. For example, irradiation with laser light, punching, etching, blasting or the like can be employed. Alternatively, the holding member 10 having the through-holes 11 may be formed by compression molding, transfer molding or injection molding with use of a die. Forming the holding member 10 with use of a die allows for reducing variation of a shape of each of the through-holes 11. The inner lateral surfaces 101 of the through-holes 11 may be made substantially smooth by a known method such as polishing or the like.

Step 1-2: Arranging the Holding Member 10 on a Support Member 20

As shown in FIG. 1B, the holding member 10 is bonded to the support member 20 made of a heat-resistant sheet or the like such that the lower surface 103 of the holding member 10 is in contact with the support member 20. Accordingly, the through-holes 11 are closed at the bottom.

Step 1-3: Filling Each of the Plurality of Through-Holes 11 with the Wavelength Conversion Member 30

As shown in FIG. 3A, each of the plurality of through-holes 11 is filled with the wavelength conversion member 30 containing fluorescent particles 31 and a light transmissive member 32 such that the wavelength conversion member 30 is in contact with the inner lateral surfaces 101 defining each of the plurality of through-holes 11. Each of the plurality of through-holes 11 may be filled with the wavelength conversion member 30 by any appropriate method known in the art. For example, printing, potting or the like may be used. The wavelength conversion member 30 may contain a light diffusive material. With the wavelength conversion member 30 containing a light diffusive material, light from a light emitting element 60 (FIG. 9, etc.; described below) is diffused in the wavelength conversion member 30. Therefore, color unevenness or luminance unevenness in the wavelength conversion member 30 can be reduced. Each of fluorescent particles 31 may have an appropriate diameter, and the diameter may be appropriately adjusted. The fluorescent particles 31 may each have a diameter of, for example, in a range of about 1 μm to about 50 μm.

Figure 3B:
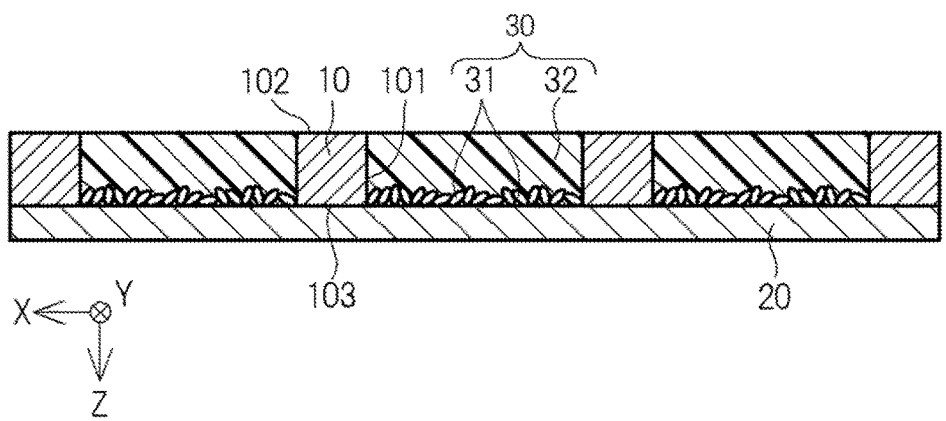
FIG. 3B is a schematic cross-sectional view showing a modification of the step of filling each of the plurality of holes with the wavelength conversion member in the first embodiment.

As shown in FIG. 3B, in the step of filling each of the through-holes 11 with the wavelength conversion member 30, the fluorescent particles 31 in the wavelength conversion member 30 may be disposed predominantly in a region closer to a support member 20, namely, closer to the lower surface 103. The fluorescent particles 31 may be predominantly disposed in a region closer to the lower surface 103 of the holding member 10 by, for example, spontaneous sedimentation or forced sedimentation using a centrifugal force.

Step 1-4: Molding the Wavelength Conversion Member 30

The wavelength conversion member 30 filled in each of the through-holes 11 is cured to be molded. In this specification, the expression that "the wavelength conversion member is cured" includes both the state in which the wavelength conversion member is completely cured and the state in which the wavelength conversion member is semi-cured so as to allow the shape of the wavelength conversion member to be kept.

Step 1-5: Taking the Wavelength Conversion Member 30 Out from the Holding Member 10

Figure 4:
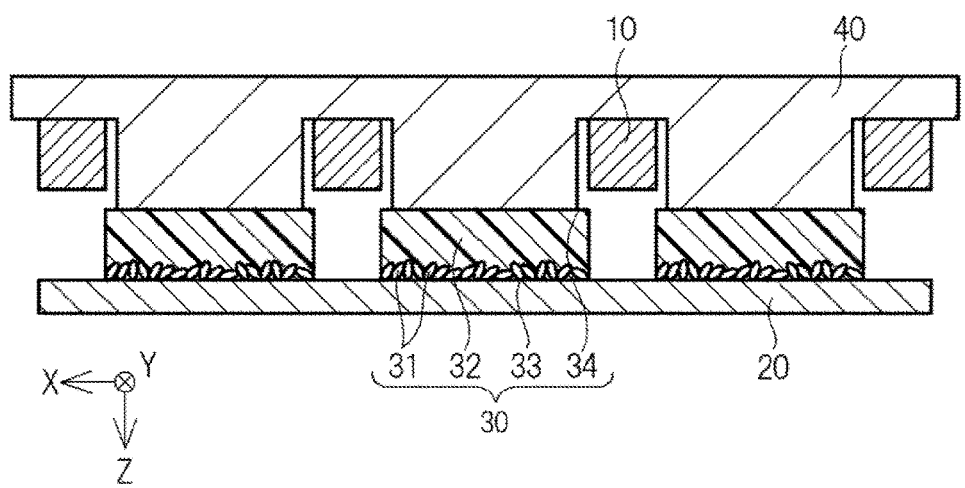
FIG. 4 is a schematic cross-sectional view showing a step of taking the wavelength conversion member out from the holding member in the first embodiment.

Each wavelength conversion member 30 is taken out from the holding member 10. The wavelength conversion member 30 may be taken out from the holding member 10 by dissolving the holding member 10, pushing the wavelength conversion member 30, applying a centrifugal force to the wavelength conversion member 30, or the like. It is particularly preferable that, as shown in FIG. 4, the wavelength conversion member 30 is taken out from the holding member 10 by attaching a pushing member 40 to the wavelength conversion member 30 and pushing the wavelength conversion member 30 out. Directly pushing the wavelength conversion member 30 out can facilitate taking the wavelength conversion member 30 out from the holding member 10. In the case of taking the wavelength conversion member 30 out from the holding member 10 by pushing, the holding member 10 may be secured, and then the wavelength conversion member 30 may be pushed downward by the pushing member 40 to be taken out from the holding member 10. Alternatively, the wavelength conversion member 30 may be taken out by the pushing member 40 and secured, and then the holding member 10 may be moved upward to take the wavelength conversion member 30 out from the holding member 10.

A contact area between the pushing member 40 and the wavelength conversion member 30 is preferably in a range of 0.5 times as large as an area of a surface of the wavelength conversion member 30 that is pushed by the pushing member 40 to the area of a surface of the wavelength conversion member 30 that is pushed by the pushing member 40. With the area of the contact surface between the pushing member 40 and the wavelength conversion member 30 of 0.5 times as large as the area of the surface of the wavelength conversion member 30 that is pushed by the pushing member 40 or greater, a trace of the pushing member 40 is not easily left on the wavelength conversion member 30 at the time of pushing. Further, with the inner side surfaces 101 of each of the through-holes 11 that are substantially smooth, the area of a contact surface between the wavelength conversion member 30 and the holding member 10 can be reduced than in the case where the inner lateral surfaces 101 have irregularities.

Therefore, the wavelength conversion member 30 can be more easily taken out from the holding member 10. In the step of taking the wavelength conversion member 30 out from the holding member 10 by pushing, it is preferable to push the wavelength conversion member 30 disposed in each of the plurality of through-holes 11 at the same time. With such an arrangement, the operation time is shortened than in the case where each wavelength conversion member 30 is pushed out from the through-holes 11 one by one.

If a force is applied to the fluorescent particles 31, the fluorescent particles 31 may be broken, so that the diameter thereof may be decreased. If the diameter of the fluorescent particles 31 is decreased, light from the light emitting element 60 (described below) may be more easily scattered, which may lead to decrease in the luminance of a light emitting device. In the case where the fluorescent particles 31 are located predominantly on one side as shown in FIG. 4, it is preferable that a surface 34 of the wavelength conversion member 30 that is opposite to the surface 33, on which the fluorescent particles 31 are predominantly disposed, is pushed out to take the wavelength conversion member 30 out from the holding member 10. With such an arrangement, the force applied to the fluorescent particles 31 at the time of pushing can be decreased. Therefore, breakage of the fluorescent particles 31 can be reduced, and thus decrease in the luminance of the light emitting device can be prevented.

Figure 5:
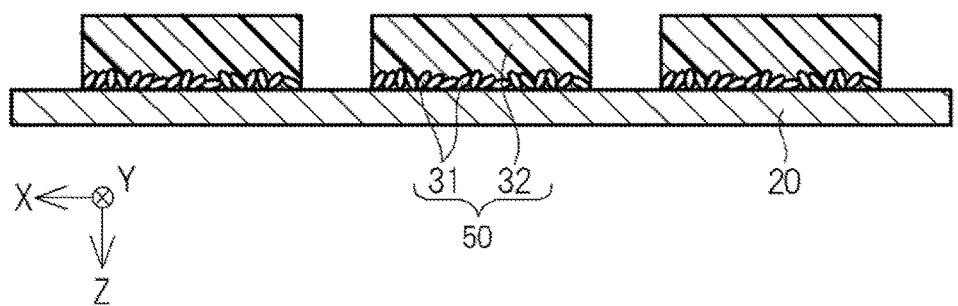
FIG. 5 is a schematic cross-sectional view showing light transmissive elements.

Through the above-described steps, as shown in FIG. 5, a plurality of light transmissive elements 50 each including the fluorescent particles 31 and the light transmissive member 32 can be provided. In this specification, the wavelength conversion member 30 after being taken out from the holding member 10 is referred to as the "light transmissive element 50". Because the light transmissive elements 50 are molded in the through-holes 11 of the holding member 10, and thus the method of producing thereof does not include a cutting step. With this manner, the fluorescent particles 31 can be prevented from protruding from a surface of the light transmissive element 50.

Further, a protective layer may be disposed on a surface of each of fluorescent particles for the purpose of protecting the fluorescent particles against moisture or the like. In the case where the fluorescent sheet is cut to singulate by the conventional method, a portion of the protective layer on surfaces of the fluorescent particles may be removed in the cutting step. In this embodiment, the method of producing the light transmissive element 50 does not include the cutting step. Accordingly, the protective layer on the surfaces of the fluorescent particles 31 can be prevented from being unintentionally removed. The light transmissive element 50 may have any appropriate size, and the size may be appropriately adjusted. For example, the light transmissive element 50 may have a size of 0.2 mm×0.2 mm to 3 mm×3 mm in a plan view.

Second Embodiment

With reference to FIG. 5 through FIG. 8B, a method of producing a light transmissive element in a second embodiment will be described. The light transmissive element produced in the second embodiment is different from the light transmissive element 50 produced in the first embodiment in the shape of each of the plurality of holes.

Step 2-1: Preparing a Holding Member 10

Figure 6A:
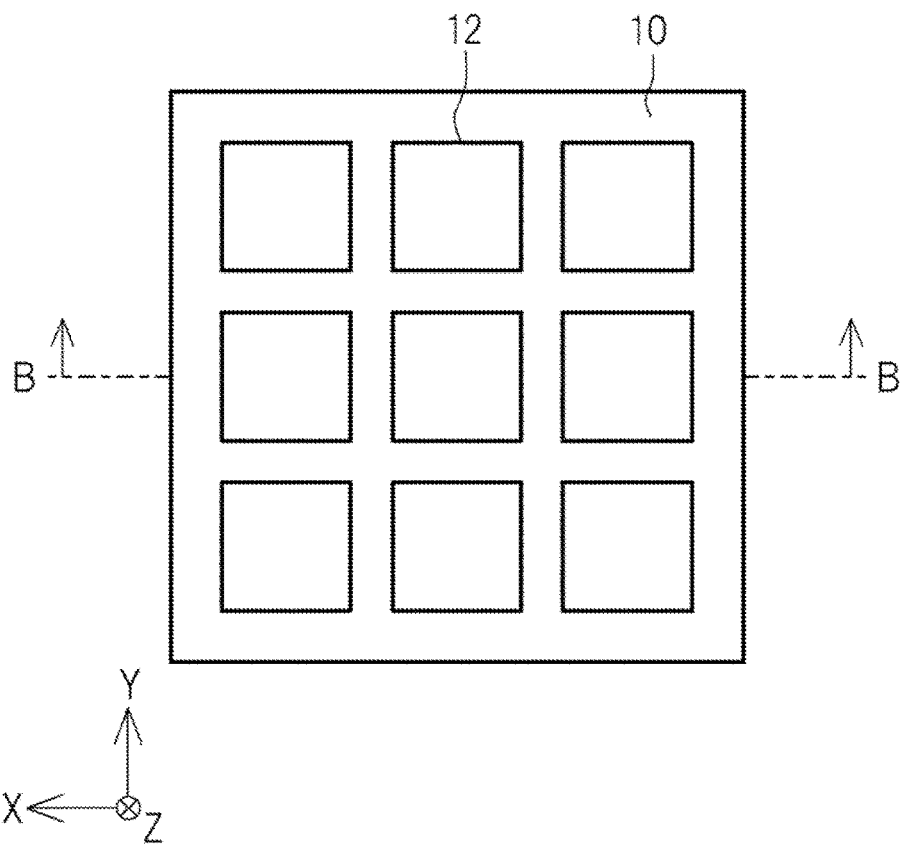
FIG. 6A is a plan view showing a step of preparing a holding member in a second embodiment.
Figure 6B:
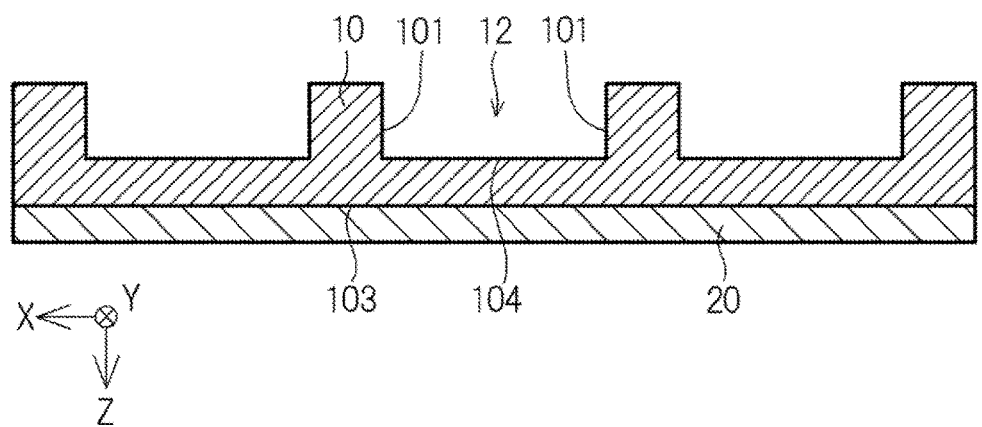
FIG. 6B is a schematic cross-sectional view taken along line B-B in FIG. 6A.

As shown in FIG. 6B, the second embodiment is different from the first embodiment in that the holding member 10 includes a plurality of recessed portions 12 each defined by inner lateral surfaces 101 and a bottom surface 104 and the recessed portions 12 serve as the plurality of holes, while the through-holes 101 serve as the plurality of holes in the first embodiment. The inner lateral surfaces 101 of each of the recessed portions 12 are also substantially smooth in a cross-sectional view, like the inner lateral surfaces 101 of the through-holes 11 in the first embodiment. As seen in a plan view, the recessed portions 12 may each have a quadrangular shape made of straight lines as shown in FIG. 6B, may each have a circular shape made of a curved line, or may each have a shape made of a straight line and a curved line.

The recessed portions 12 may be formed in the holding member 10 by any method known in the art. For example, irradiation with laser light, etching, blasting or the like may be used. Alternatively, the holding member 10 including the recessed portions 12 may be formed by compression molding, transfer molding or injection molding using a die. Forming the holding member 10 using a die allows for reducing variation in the shape of the recessed portions 12.

Step 2-2: Filling the Plurality of Recessed Portions 12 with a Wavelength Conversion Member 30

Figure 7A:
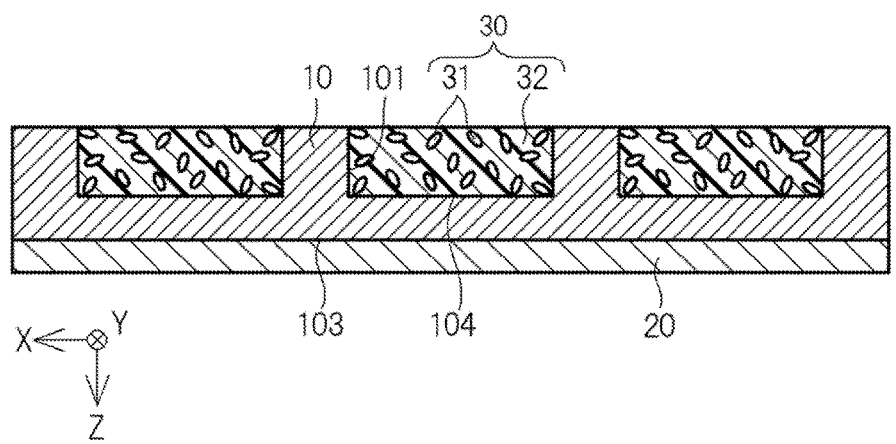
FIG. 7A is a schematic cross-sectional view showing a step of filling each of a plurality of holes with a wavelength conversion member in the second embodiment.

As shown in FIG. 7A, each of the plurality of recessed portions 12 are filled with the wavelength conversion member 30 containing fluorescent particles 31 and a light transmissive member 32. Each of the plurality of recessed portions 12 may be filled with the wavelength conversion member 30 by a method similar to that in the first embodiment.

Figure 7B:
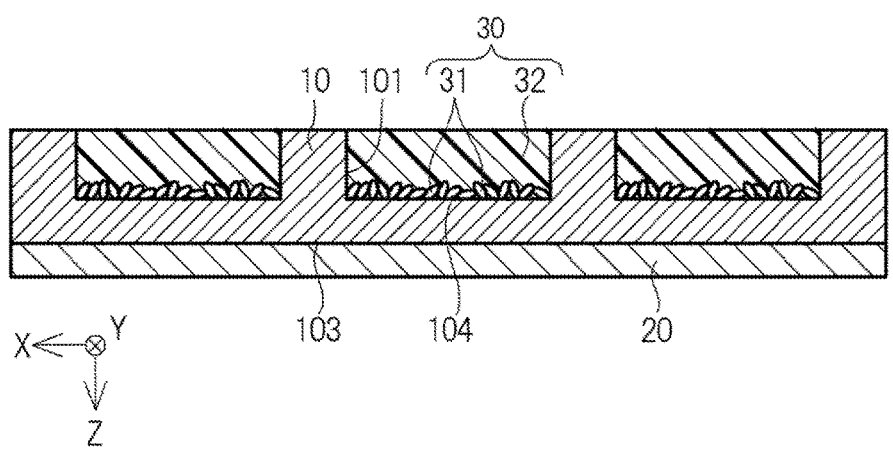
FIG. 7B is a schematic cross-sectional view showing a variant example of the step of filling each of the plurality of holes with the wavelength conversion member in the second embodiment.

As shown in FIG. 7B, in the step of filling each of the recessed portions 12 with the wavelength conversion member 30, the fluorescent particles 31 may be disposed unevenly in the wavelength conversion member 30. The fluorescent particles 31 may be caused to be located unevenly by any of substantially the same methods described above in the first embodiment.

Step 2-3: Molding the Wavelength Conversion Member 30

The wavelength conversion member 30 filling the recessed portions 12 is cured to be molded.

Step 2-4: Taking the Wavelength Conversion Member 30 Out from the Holding Member 10

Figure 8A:
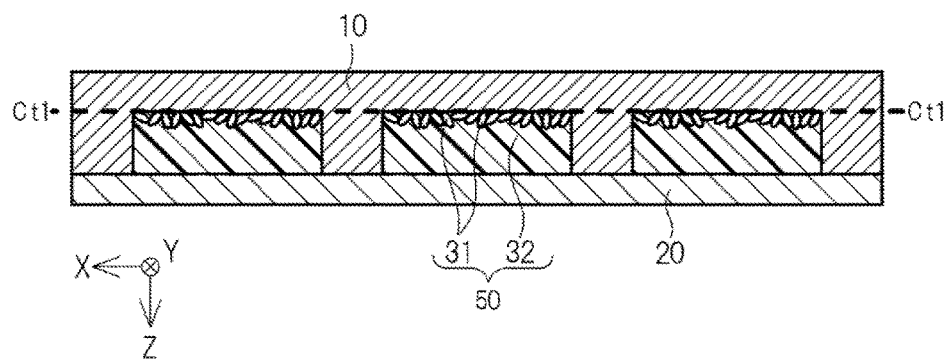
FIG. 8A is a schematic cross-sectional view showing a step of taking out of the holding member in the second embodiment.
Figure 8B:
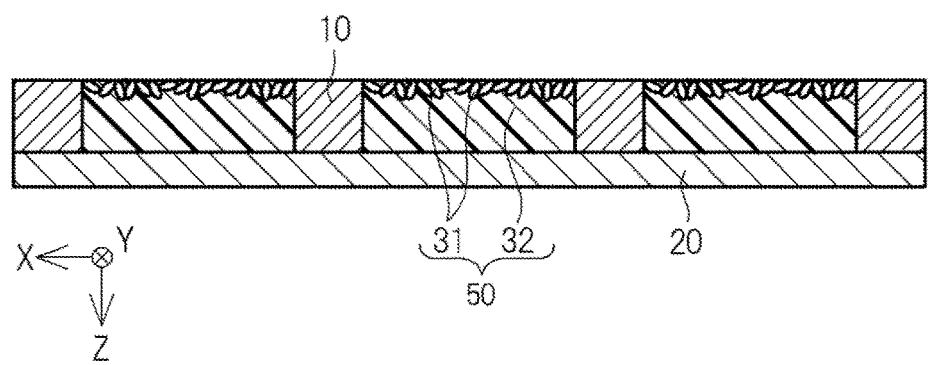
FIG. 8B is a schematic cross-sectional view showing the step of taking out of the holding member in the second embodiment.

The wavelength conversion member 30 is taken out from the holding member 10. The wavelength conversion member 30 may be taken out from the holding member 10 by dissolving the holding member 10, applying a centrifugal force to the wavelength conversion member 30, or the like. Alternatively, as shown in FIG. 8A, a portion of the holding member 10 above line Ct1-Ct1 may be removed, which allows an upper surface and a lower surface of the wavelength conversion member 30 to be exposed from the holding member 10. In this manner, as shown in FIG. 8B, the wavelength conversion member 30 disposed in each of the through-holes can be obtained.

Therefore, as in the first embodiment, the wavelength conversion member 30 may be pushed by the pushing member 40 to be taken out from the holding member 10. In each of the steps, the up-down direction of each of the holding member 10 and the wavelength conversion member 30 may be appropriately changed.

Through the above-described steps, as shown in FIG. 5, a plurality of light transmissive elements 50 each including the fluorescent particles 31 and the light transmissive member 32 are provided. The light transmissive elements 50 are molded in the recessed portions 12 of the holding member 10, and thus the method of producing the light transmissive element 50 does not include a cutting step. Accordingly, the fluorescent particles 31 can be prevented from protruding from a surface of the light transmissive elements 50.

Third Embodiment

Production of the Light Emitting Device

Step A-1: Bonding the Light Transmissive Element 50 and a Light Emitting Element 60

Figure 9:
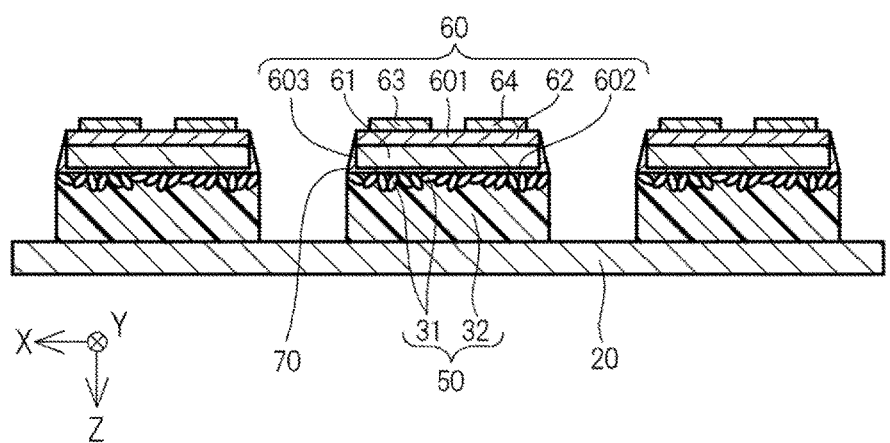
FIG. 9 is a schematic cross-sectional view showing a step of bonding a light transmissive element and a light emitting element to each other in a third embodiment.

As shown in FIG. 9, the light transmissive element 50 produced by any of the above-described methods and the light emitting element 60 are bonded together with a light transmissive bonding member 70. A plurality of the light emitting elements 60 may be bonded to one light transmissive element 50. The light emitting element 60 includes a light transmissive substrate 61 such as a sapphire substrate or the like, a semiconductor layered body 62 provided on the light transmissive substrate 61, and a plurality of electrodes 63 and 64 disposed on an upper surface of the semiconductor layered body 62. The electrodes 63 and 64 may each have any appropriate shape. In the present specification, an "electrode formation surface" of the light emitting element 60 refers to a surface of the light emitting element 60 except for the electrodes 63 and 64. The light emitting element 60 includes an electrode formation surface 601 on which the plurality of electrodes 63 and 64 are disposed, a light extraction surface 602 opposite to the electrode formation surface 601, and lateral surfaces 603 between the electrode formation surface 601 and the light extraction surface 602. In the present embodiment, the electrode formation surface 601 corresponds to the upper surface of the semiconductor layered body 62, and the light extraction surface 602 corresponds to a lower surface of the light transmissive substrate 61.

The bonding member 70 bonds the light extraction surface 602 of the light emitting element 60 and the light transmissive element 50 to each other. The bonding member 70 may cover the light extraction surface 602 and the side surfaces 603 of the light emitting element 60. With the bonding member 70 covering the light extraction surface 602 and the lateral surfaces 603 of the light emitting element 60, the adhesiveness between the light emitting element 60 and the light transmissive element 50 may be increased, and thus is preferable. The bonding member 70 has a transmittance of light from the light emitting element 60 higher than a reflective member 80 (FIG. 8; described below). Therefore, it is preferable that the bonding member 70 covers the lateral surfaces of the light transmissive substrate 61 and the lateral surfaces of the semiconductor stack 62. With such a structure, light from the light emitting element 60 is easily extracted to the outside of the light emitting element 60 through the bonding member 70.

In the case where the fluorescent particles 31 are disposed unevenly in the wavelength conversion member 30, it is preferable that a surface of the light transmissive element 50 along which the fluorescent particles 31 are predominantly disposed, and the light extraction surface 602 of the light emitting element 60, are bonded together. With such an arrangement, even in the case where a material vulnerable to moisture is used for the fluorescent particles 31, the light transmissive member 32 serves as a protective layer, which allows the fluorescent particles 31 to be prevented from being deteriorated, so that chromaticity can be kept good. Examples of the material of the fluorescent particles 31 that are vulnerable to moisture include a fluoride-based fluorescent material, a sulfide-based fluorescent material, a chloride-based fluorescent material, a silicate-based fluorescent material, a phosphate-based fluorescent material, and the like.

Step A-2: Forming the Reflective Member 80

Figure 10:
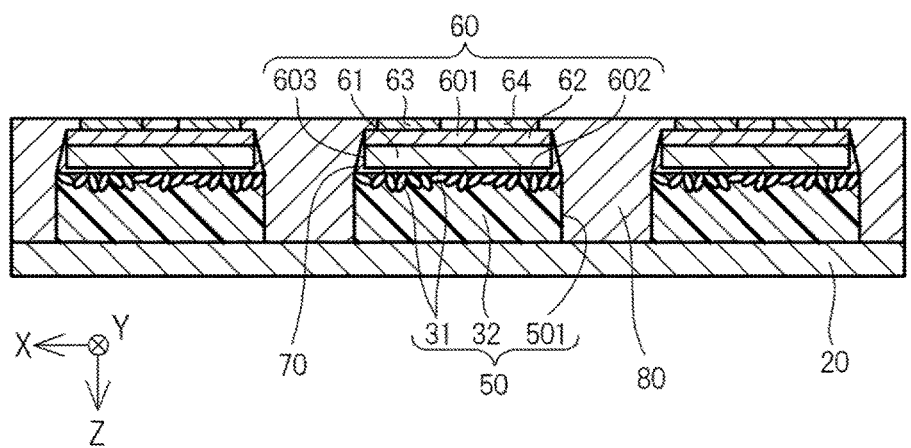
FIG. 10 is a schematic cross-sectional view showing a step of forming a reflective member in the third embodiment.

As shown in FIG. 10, the reflective member 80 is formed to cover the lateral surfaces 603 of the light emitting element 60, lateral surfaces 501 of the light transmissive element 50 and the bonding member 70. In the case where a plurality of the light emitting elements 60 are disposed, the reflective member 80 may be formed to fill a space between the light emitting elements 60 adjacent to each other. The reflective member 80 may further cover a portion of the electrode formation surface 601 of each of the light emitting element 60 on which neither the electrode 63 nor 64 is formed. In this case, the thickness of the reflective member 80 may be adjusted (i.e., the size of the reflective member 80 in a Z direction may be adjusted) such that the electrodes 63 and 64 are partially exposed from the reflective member 80.

After the reflective member 80 is formed to have a thickness that allows for embedding the electrodes 63 and 64, a portion of the reflective member 80 may be removed to expose the electrodes 63 and 64. A portion of the reflective member 80 may be removed by any method known in the art, for example, etching, shearing, shaving, polishing, blasting or the like.

Step A-3: Removing a Portion of the Light Transmissive Element 50

Figure 11A:
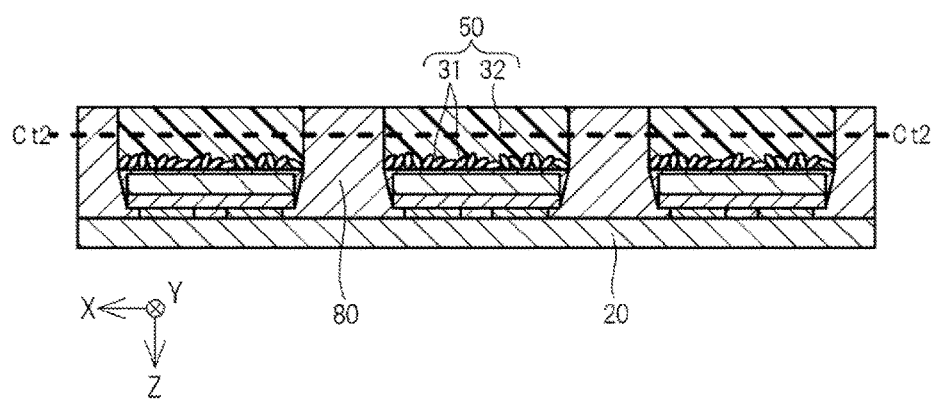
FIG. 11A is a schematic cross-sectional view showing a step of removing a portion of the light transmissive element in the third embodiment.
Figure 11B:
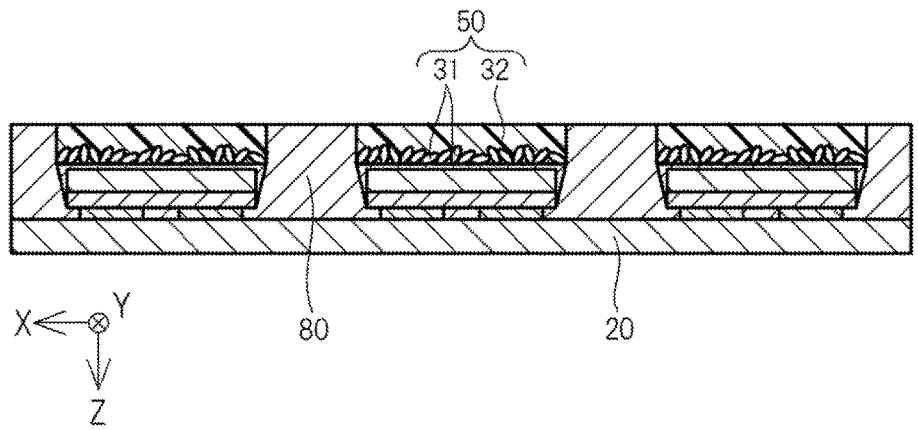
FIG. 11B is a schematic cross-sectional view showing the step of removing a portion of the light transmissive element in the third embodiment.

As shown in FIG. 11A, in the case where the fluorescent particles 31 are located unevenly in the wavelength conversion member 30, a portion of the light transmissive member 32 above line Ct2-Ct2 may be removed. That is, a portion of the light transmissive member 32 that is on the side opposite to the side on which the fluorescent particles 31 are predominantly disposed may be removed. For removing a portion of the light transmissive member 32 that is on the side opposite to the side on which the fluorescent particles 31 are predominantly disposed, it is preferable that a portion of the light transmissive member 32 that contains substantially no fluorescent particle 31 is removed. In other words, in the case of removing a portion of the light transmissive element 50, it is preferable that only the light transmissive member 32 is removed. With such an arrangement, as shown in FIG. 11B, the light transmissive element 50 can be thinned without substantially changing the amount of the fluorescent particles 31 contained in the wavelength conversion member 30. Thus, the light emitting device can also be thinned. Removing a portion of the light transmissive member 32 that contains substantially no fluorescent particle 31 allows the fluorescent particle 31 to be prevented from protruding from a surface of the light transmissive element 50 at which the light transmissive member 32 has been removed. When a portion of the light transmissive member 32 is removed, a portion of the reflective member 80 may be removed at the same time.

In the case where the wavelength conversion member 30 is taken out from the holding member 10 by pushing the surface opposite to the side on which the fluorescent particles 31 are predominantly disposed as described above, it is preferable that a portion of the light transmissive member 32 that is on the side opposite to the side on which the fluorescent particles 31 are predominantly disposed is removed, for the reason below. A trace of pushing may be left on the surface of the light transmissive member 32 on the side opposite to the side on which the fluorescent particles 31 are predominantly disposed.

By removing a portion of the light transmissive member 32 on the side opposite to the side on which the fluorescent particles 31 are predominantly disposed, such a trace can be removed. The light transmissive member 32 and/or the reflective member 80 may be removed by any method known in the art, for example, etching, cutting, shaving, polishing, blasting or the like.

Step A-4: Singulating into Individual Light Emitting Devices

Figure 12A:
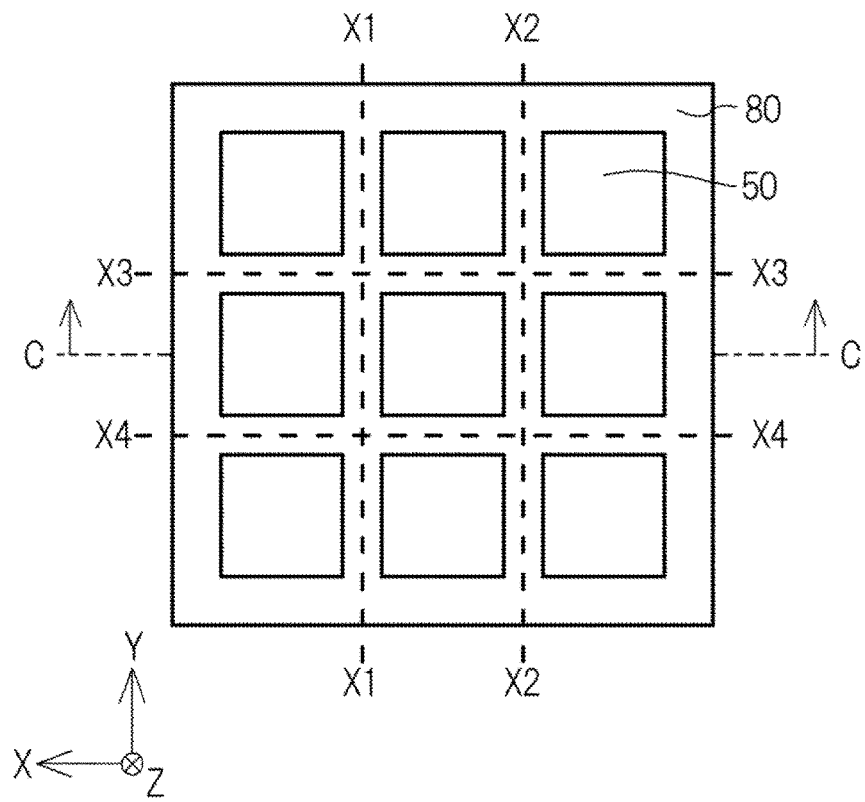
FIG. 12A is a plan view showing a step of providing individual light emitting devices in the third embodiment.
Figure 12B:
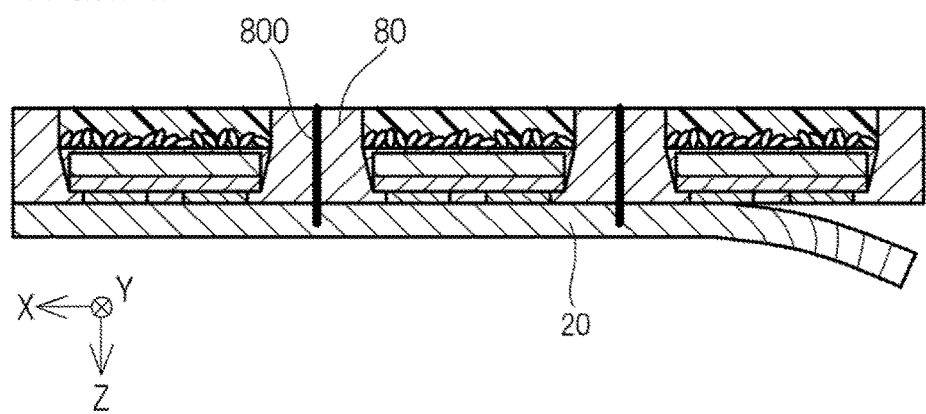
FIG. 12B is a schematic cross-sectional view taken along the line C-C in FIG. 12A.

In the case where the reflective member 80 is formed to fill the space between the light emitting elements 60 adjacent to each other, the reflective member 80 is cut between such light emitting elements 60 to singulate into individual light emitting devices. As shown in FIG. 12A, the reflective member 80 and the support member 20 are cut by, for example, a dicing device or the like along dashed line X1, dashed line X2, dashed line X3 and dashed line X4 running at a middle portion between adjacent light emitting elements 60, in order to provide individual light emitting elements 60. Then, the support member 20 is removed, so that the light emitting devices are obtained. At the time of cutting the reflective member 80 and the support member 20, it is preferable that the support member 20 is not completely cut. More specifically, as shown in FIG. 12B, it is preferable that the reflective member 80 is completely cut by a cutting portion 800, while the support member 20 is kept partially continuous. With such an arrangement, the support member 20 is not divided into a plurality of pieces, and therefore, can be removed at once. Alternatively, the support member 20 may be first removed, and then the reflective member 80 may be cut. The reflective member 80 may be cut at a portion that allows the individual light emitting device to include a plurality of light emitting elements 60.

With the above-described method of producing the light emitting device, leaking of light through the reflective member 80 covering the side surfaces of the light transmissive element 50 can be reduced. The method of producing the light transmissive element 50 does not include the cutting step, so that the fluorescent particles 31 can be prevented from protruding from a surface of the light transmissive element 50. Accordingly, the fluorescent particles 31 protruding from the light transmissive element 50 can be prevented from penetrating through the reflective member 80 covering the surface of the light transmissive element 50, and the reflective member 80 can be prevented from being thinned by the amount at which the fluorescent particles 31 protrude. Thus, leakage of light from the light emitting element 60 through the reflective member 80 can be reduced.

In the description below, materials and the like suitable for respective components of the light transmissive elements 50 in the first and second embodiments and respective components of the light emitting device in the third embodiment will be described.

Holding Member 10

The holding member 10 is a mold that includes an upper surface having a plurality of holes each including substantially smooth inner lateral surfaces in a cross-sectional view, and allows the plurality of holes to be filled with a wavelength conversion member, so that a light transmissive element can be molded. For the holding member 10, a metal material, a resin material or the like may be used. In the case where the holding member 10 is not processed in the step of taking out the wavelength conversion member 30 or the like, it is preferable that the holding member 10 is made of a metal material. Since the metal material is less easily deteriorated than a resin material, the holding member 10 made of a metal material is usable in repetition. In the case where the holding member 10 is processed in the step of taking out the wavelength conversion member 30 or the like, it is preferable that holding member 10 is made of a resin material. The holding member 10 made of a resin material can be more easily processed than in the case where the holding member 10 is made of a metal material.

Wavelength Conversion Member 30

The wavelength conversion member 30 converts light of a first peak wavelength directed thereto into light of a second peak wavelength different from the first peak wavelength. The wavelength conversion member 30 contains the fluorescent particles 30 and the light transmissive member 32.

Fluorescent Particles 31

The fluorescent particles 31 may be made of a material excitable by light from the light emitting element 60. Examples of the material for the fluorescent particles 31 that are excitable by a blue light emitting element or an ultraviolet light emitting element include a yttrium-aluminum-garnet-based fluorescent material activated by cerium (YAG:Ce); a lutetium-aluminum-garnet-based fluorescent material activated by cerium (LAG:Ce); a nitrogen-containing calcium aluminosilicate-based fluorescent material activated by europium and/or chromium ($CaO-Al_2O_3-SiO_2$: Eu, Cr); a silicate-based fluorescent material activated by europium (($Sr,Ba)_2SiO_4$:Eu); a β sialon fluorescent material; a nitride-based fluorescent material such as a CASN-based fluorescent material, an SCASN-based fluorescent material or the like; a fluoride-based fluorescent material such as a KSF-based fluorescent material or the like; a sulfide-based fluorescent material; a chloride-based fluorescent material; a silicate-based fluorescent material; a phosphate-based fluorescent material; and the like. A light emitting device configured to emit light of various wavelength may be produced by combining such fluorescent particles and a blue light emitting element or an ultraviolet light emitting element.

The method of producing the light transmissive element 50 according to each of the first and the second embodiments does not include a cutting step.

Therefore, even the fluorescent particles 31 with a great hardness can be prevented from protruding from a surface of the light transmissive element 50. Examples of the material for the fluorescent particles 31 of a great hardness include a β sialon fluorescent material, a CASN-based fluorescent material, an SCASN-based fluorescent material, and the like.

The fluorescent particles 31 may be made of a fluorescent material vulnerable to moisture. Examples of the material for the fluorescent particles 31 that are vulnerable to moisture include a fluoride-based fluorescent material, a sulfide-based fluorescent material, a chloride-based fluorescent material, a silicate-based fluorescent material, a phosphate-based fluorescent material, and the like. $K_2SiF_6$:Mn, which is a fluoride-based fluorescent material, is particularly preferable. In the case where, for example, a large fluorescent sheet is cut into individual pieces as in a conventional method, water is often used in order to decrease the temperature at the time of cutting or wash away the cutting residues generated by the cutting. However, such a cutting using water may deteriorate the fluorescent particles that are vulnerable to moisture. In the production method according to each of the first and the second embodiments, water may not be used at the time of singulating into a plurality of individual light transmissive members by cutting, and thus allows a fluorescent material vulnerable to moisture to be used for the fluorescent particles 31.

Fluorescent particles having an aspect ratio of 1.5 or greater may be used. In this specification, the term "aspect ratio" refers to a ratio obtained by, based on Japanese Industrial Standards (JIS Z 8900-1:2008), capturing an image of 100 or more particles using scanning electron microscope, measuring a value of the maximum diameter of each of the particles and a value of the width perpendicular to the maximum diameter of each of the particles, and determining the average value of the maximum diameter and the average value of the width.

The obtained average ratio is the "aspect ratio". In the case where a large fluorescent sheet is cut into individual pieces as in a conventional method, the higher the aspect ratio is, the more the fluorescent particles easily protrude from a surface of the light transmissive element. This is because fluorescent particles of an elliptical shape having a high aspect ratio, compared with fluorescent particles having a circular shape, which has a low aspect ratio, have more varied width in a direction perpendicular to the cut surface even if the fluorescent particles has uniform grain diameter. The method of producing according to each of the first and second embodiments does not include a cutting step. Therefore, even fluorescent particles having an aspect ratio of 1.5 or greater can be prevented from protruding from a surface of the light transmissive element. Examples of the material for the fluorescent particles 31 having a high aspect ratio include a β sialon fluorescent material.

Light Transmissive Member 32

The light transmissive member 32 may be made of a light transmissive resin material, a glass material, or the like. Examples of the light transmissive resin material include thermosetting resins such as silicone resin, silicone-modified resin, epoxy resin, phenol resin, and the like; and thermoplastic resins such as polycarbonate resin, acrylic resin, methylpentene resin, polynorbornene resin, and the like. In particular, silicone resin, which has a high light resistance and a high heat resistance, is preferable. It is preferable that such a light transmissive resin has a high light transmittance.

Light Diffusive Material

The wavelength conversion member 30 may contain a light diffusive material in order to reduce luminance unevenness or color unevenness. Examples of the light diffusive material include titanium oxide, zirconium oxide, aluminum oxide, silicon oxide and the like. In particular, titanium oxide, which is relatively stable against moisture or the like and has a high refractive index, is preferable.

Light Emitting Element 60

For the light emitting element 60, a known semiconductor element made of a nitride semiconductor and other materials may be used. An emission wavelength of the light emitting element 60 may be selected from a visible light range (370 nm to 780 nm) or an ultraviolet light range. For example, for the light emission element 60 for emitting light of a peak wavelength of 430 to 490 nm, a nitride semiconductor may be used. Examples of the nitride semiconductor include $In_XAl_YGa_{1-X-Y}N$ ($0 \leq X$, $0 \leq Y$, $X+Y \leq 1$) or the like. The light emitting element 60 includes the light transmissive substrate 61, the semiconductor layered body 62 disposed thereon, and the electrodes 63 and 64.

Light Transmissive Substrate 61

For the light transmissive substrate 61 of the light emitting element 60, for example, a light transmissive insulating material such as sapphire ($Al_2O_3$) or the like, or a semiconductor material transmitting light from the semiconductor layered body 62 (e.g., nitride semiconductor) may be used.

Bonding Member 70

The bonding member 70 may be made of a light transmissive resin. For the light transmissive resin, thermosetting light transmissive resins such as silicon resin, silicone-modified resin, epoxy resin, phenol resin or the like can be preferably used. The bonding member 70 is in contact with the light emitting element 60, and thus is easily influenced by heat generated by the light emitting element 60 upon light emission. A thermosetting resin has a good heat resistance and thus is suitable for the bonding member 70. It is preferable that the bonding member 70 has a high transmittance with respect to light from the light emitting element 60.

Reflective Member 80

The reflective member 80 may be made of a light reflective resin. A "light reflective resin" is a resin having a high reflectance, for example, a reflectance of 70% or greater, with respect to light from the light emitting element 60. For the light reflective resin, for example, a light transmissive resin containing a light reflective substance dispersed therein. Examples of the light reflective substance include titanium oxide, aluminum oxide, zirconium oxide, magnesium oxide and the like. Such a light reflective substance may be in a shape of particles, fibers, thin flakes or the like. In particular, fiber-shaped light reflective substance is preferable because a fiber-type light reflective substance allows for reducing the thermal expansion coefficient of the reflective member 80, and accordingly, for example, the difference in the thermal expansion coefficient between the reflective member 80 and the light emitting element 60 can be decreased. For the light transmissive resin to be contained in the light reflective resin, a thermosetting light transmissive resins such as silicone resin, silicone-modified resin, epoxy resin, phenol resin, or the like may be used. In particular, silicone resin, which has a high light resistance and a high heat resistance, is preferable.

Certain embodiments of the present disclosure are described above. The present disclosure is not limited to any of the above-described embodiments, and may be carried out in any form without departing from the scope of the present disclosure.

While the present invention has been described with respect to exemplary embodiments thereof, it will be apparent to those skilled in the art that the disclosed invention may be modified in numerous ways and may assume many embodiments other than those specifically described above.

Accordingly, it is intended by the appended claims to cover all modifications of the invention that fall within the true spirit and scope of the invention.

What is claimed is:

1. A method of producing a light transmissive element comprising:
    providing a holding member including an upper surface and a plurality of holes, each of the plurality of holes extending through the holding member and having at least one inner lateral surface that is a substantially smooth surface and an opening in the upper surface of the holding member;
    filling the plurality of holes with a wavelength conversion member containing fluorescent particles and a light transmissive member such that the wavelength conversion member is in contact with the inner lateral surface of each of the plurality of holes;
    molding the wavelength conversion member; and
    taking out the wavelength conversion member from the holding member after the molding of the wavelength conversion member.

2. The method of producing a light transmissive element according to claim 1, wherein
    the filling of the plurality of holes with the wavelength conversion member includes disposing the fluorescent particles predominantly on one side of the wavelength conversion member.

3. The method of producing a light transmissive element according to claim 2, wherein
    the taking out of the wavelength conversion member includes pushing a surface of the wavelength conversion member opposite to a side on which the fluorescent particles are predominantly disposed to take out the wavelength conversion member from the holding member.

4. The method of producing a light transmissive element according to claim 1, wherein
    the taking out of the wavelength conversion member includes pushing the wavelength conversion member through the holes to take out the wavelength conversion member from the holding member.

5. The method of producing a light transmissive element according to claim 4, wherein
    the pushing of the wavelength conversion member includes using a pushing member in contact with the wavelength conversion member.

6. The method of producing a light transmissive element according to claim 1, wherein
    the fluorescent particles contain a fluoride-based fluorescent material.

7. The method of producing a light transmissive element according to claim 1, wherein
    the fluorescent particles contain a β sialon fluorescent material.

8. The method of producing a light transmissive element according to claim 1, wherein
    the fluorescent particles have an aspect ratio of 1.5 or greater.

9. A method of producing a light emitting device comprising:
    producing a light transmissive element by
        providing a holding member including an upper surface and a plurality of holes, each of the plurality of holes having at least one inner lateral surface that is a substantially smooth surface and an opening in the upper surface of the holding member,
        filling the plurality of holes with a wavelength conversion member containing fluorescent particles and a light transmissive member such that the wavelength conversion member is in contact with the inner lateral surface of each of the plurality of holes,
        molding the wavelength conversion member, and
        taking out the wavelength conversion member from the holding member after the molding of the wavelength conversion member;
    bonding a light emitting element and the light transmissive element to each other; and
    forming a reflective member covering at least one lateral surface of the light emitting element and at least one lateral surface of the light transmissive element.

10. A method of producing a light emitting device comprising:
    producing a light transmissive element by
        providing a holding member including an upper surface and a plurality of holes, each of the plurality of holes having at least one inner lateral surface that is a substantially smooth surface and an opening in the upper surface of the holding member,
        filling the plurality of holes with a wavelength conversion member containing fluorescent particles and a light transmissive member such that the wavelength conversion member is in contact with the inner lateral surface of each of the plurality of holes with the fluorescent particles being disposed predominantly on one side of the wavelength conversion member,
        molding the wavelength conversion member, and
        taking out the wavelength conversion member from the holding member after the molding of the wavelength conversion member by pushing a surface of the wavelength conversion member opposite to the side on which the fluorescent particles are predominantly disposed to take out the wavelength conversion member from the holding member;
    bonding a light emitting element and the light transmissive element to each other, with the light emitting element being bonded to a surface of the light transmissive element on the side on which the fluorescent particles are predominantly disposed; and
    forming a reflective member covering at least one lateral surface of the light emitting element and at least one lateral surface of the light transmissive element.

11. The method of producing a light emitting device according to claim 10, further comprising
    removing a portion of the light transmissive element from a side opposite to the side on which the fluorescent particles are predominantly disposed after the forming of the reflective member.

* * * * *